United States Patent [19]

Nelson et al.

[11] Patent Number: 4,907,060
[45] Date of Patent: Mar. 6, 1990

[54] ENCAPSULATED THERMOELECTRIC HEAT PUMP AND METHOD OF MANUFACTURE

[76] Inventors: John L. Nelson, 2408 Scorpius, Garland, Tex. 75042; Michael D. Gilley, 3413 Beech St., Rowlett, Tex. 75088; Dwight A. Johnson, 4912 Haverwood #1317, Dallas, Tex. 75252

[21] Appl. No.: 56,650
[22] Filed: Jun. 2, 1987
[51] Int. Cl.⁴ .............................................. H01L 23/28
[52] U.S. Cl. .......................................... 357/72; 357/87
[58] Field of Search ..................................... 357/72, 87
[56] References Cited

U.S. PATENT DOCUMENTS

| | | | |
|---|---|---|---|
| 3,470,033 | 9/1969 | Oesterhelt et al. | 357/87 X |
| 3,670,091 | 6/1972 | Frantz et al. | 357/72 X |
| 4,636,578 | 1/1987 | Feinberg | 357/27 X |
| 4,803,542 | 2/1989 | Haghiri-Tehrani et al. | 357/72 |

*Primary Examiner*—Martin H. Edlow

[57] ABSTRACT

An encapsulated thermoelectric heat pump, apparatus and method for manufacturing the encapsulated thermoelectric heat pump is disclosed. The encapsulated thermoelectric heat pump includes a plurality of spaced n-type and p-type thermoelectric elements arranged alternatively in rows and columns. The thermoelectric elements having opposing ends operatively connected to first and second metalized ceramic substrates. The first and second metalizations patterned to connect serially the thermoelectric elements. The space between the spaced thermoelectric elements is filled with a microballoon filled epoxy for substantially increasing the strength of the thermoelectric heat pump to withstand a stress of more than 2000 g's. The apparatus includes a mold cup holding the encapsulating material, a mold holding the thermoelectric heat pump mounted in the mold cup, and a vacuum means connected to the mold for drawing the encapsulating material upwardly through the spaces of the plurality of thermoelectric elements to fill the spaces for curing.

5 Claims, 2 Drawing Sheets

ENCAPSULATED THERMOELECTRIC HEAT PUMP AND METHOD OF MANUFACTURE

This invention relates to thermoelectric heat pumps and more particularly to an encapsulated thermoelectric heat pump.

BACKGROUND OF THE INVENTION

In the past typical thermoelectric heat pumps have been fabricated which have withstood gravitational forces of up to about two thousand g's for use in missile and space applications. These thermoelectric heat pumps have been fabricated of arrays of n-type and p-type semiconductor elements, electrically interconnected in series by first and second end metalizations formed on copper patterned ceramic substrates. The elements are insulated one from the other using air as the dielectric material.

Thermoelectric heat pumps fabricated as described have been found unsuitable for use in applications where acceleration forces exceeding 2000 g's have been encountered. Examples, of applications where acceleration forces exceeding 2000 g's are encountered are: artillery shells, missiles, spacecraft, and even some commercial products. In artillery shells gravitational forces of up to 30,000 g's are typical. Forces above 2000 g's have been sufficient to tear, shear and crush the typical thermoelectric heat pumps. Thus, a need exists for a thermoelectric heat pump capable of withstanding gravitational forces of up to 30,000 g's. A g is the force required to accelerate or decelerate a freely movable body at the rate of approximately 32 feet per second per second.

It will be appreciated that the weight and size parameters of the thermoelectric heat pumps for artillery and space applications remain the same or are even more critical with respect to artillery applications. Thus, any solution to be acceptable must meet severe weight and size limitations.

SUMMARY OF THE INVENTION

Accordingly it is an object of this invention to increase the high shock capability of thermoelectric heat pumps.

Another object of the invention is to provide a thermoelectric heat pump capable of withstanding gravitational forces in excess of 2000 g's.

Still another object of the invention is to provide a thermoelectric heat pump capable of withstanding tensional, shearing, and compressional forces in excess of 2000 g's.

A further object of the invention is to provide a thermoelectric heat pump capable of withstanding gravitational forces in excess of 2000 's which can be manufactured using existing manufacturing equipment and existing thermoelectric designs.

Briefly stated the invention comprises a typical thermoelectric heat pump having its thermoelectric elements encapsulated with a micro-balloon filled epoxy. The micro-balloon filled epoxy is used to occupy the air space between the thermoelectric elements to provide a suitable dielectric for insulating the thermoelectric elements and strength for the solder connections of the thermoelectric elements to the copper metalizations of the ceramic substrates.

BRIEF DESCRIPTION OF THE DRAWINGS

Other object and features of the invention will become more readily understood from the following detailed description when read in conjunction with the drawings in which.

DESCRIPTION OF A PREFERRED EMBODIMENT

Figure 1:
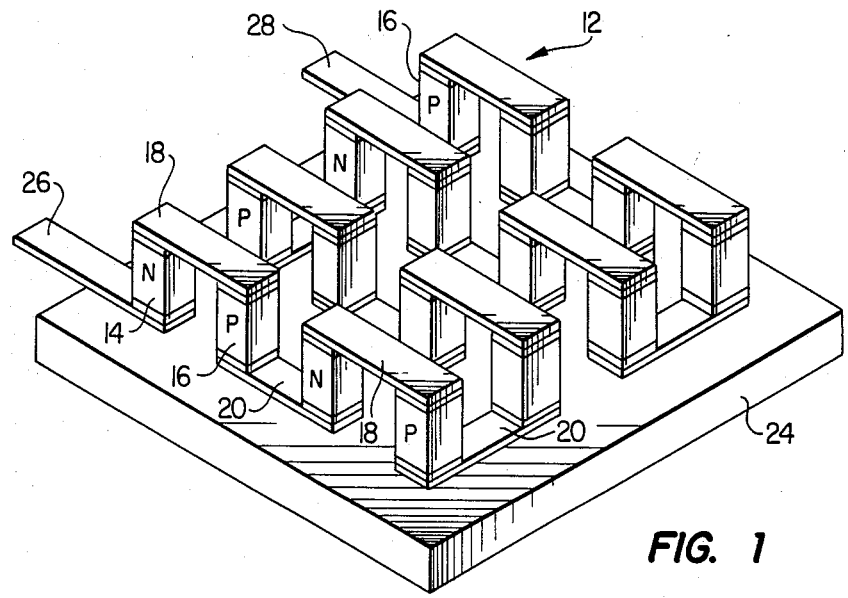
FIG. 1 is an isometric view of a typical thermoelectric heat pump.
Figure 2:
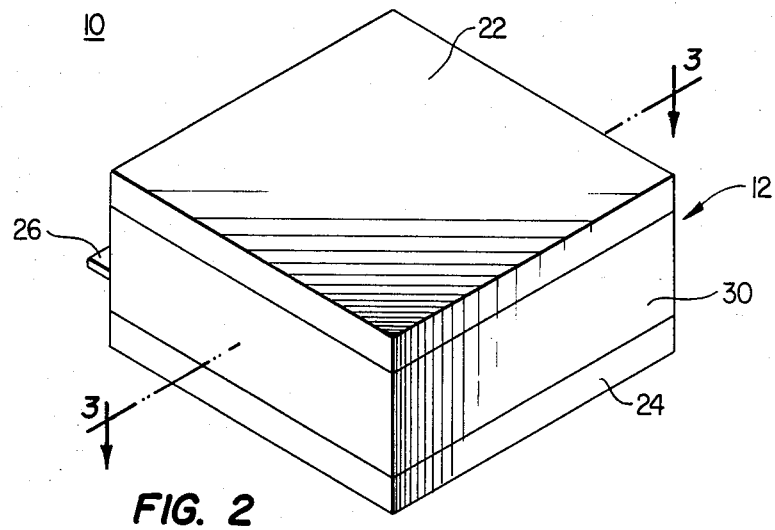
FIG. 2 is an isometric view of a thermoelectric heat pump encapsulated in accordance with the invention.
Figure 3:
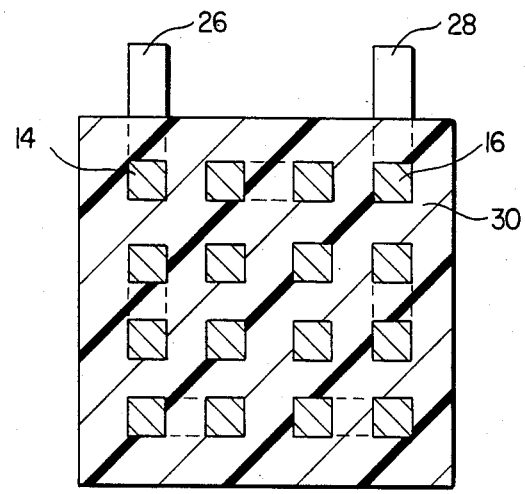
FIG. 3 is a cross-sectional view of the invention taken alone line 3—3 of FIG. 2.

The encapsulated thermoelectric heat pump 10 (FIG. 2) includes a thermoelectric heat pump 12 (FIG. 1) having a plurality of n-type and p-type semiconductor elements 14 and 26 arranged in rows and columns. The n-type and p-type semiconductor elements are arranged alternatively within the rows and columns. First and second opposing ends of the elements are plated with a metal, such as nickel, for example, for preventing diffusion of a solder therein and for forming a suitable soldering surface. The elements are then soldered to the metalizations 18 and 20 of suitable insulating substrates 22 and 24. The metalizations 18 and 20 connect serially the alternatively arranged n- and p-type thermoelectric elements in a serpentine fashion. A suitable solder is a lead-antimony solder having a eutectic point of about 251 degrees Celsius. Leads 26 and 28 are connected to the first n-type and last p-type elements, respectively.

The thermoelectric heat pump 12 (FIG. 2) is then encapsulated in a suitable material 30 having a low density, and high compression, tension, and shear resisting strengths. A suitable encapsulating material is a lower density, very high strength syntactic foam (epoxy) filled with glass Microballoons (registered trademark) sold by Emerson & Cuming under the trademark STYCAST 1090SI when mixed with Emerson & Cuming Catalyst 11 at a ratio of 12 parts catalyst to 100 parts epoxy. This epoxy filled with micro-balloons has typical properties as follows:

| | |
|---|---|
| Mixed Viscosity, cps | 1,800 |
| Specific Gravity | 0.78 |
| Thermal Conductivity, (BTU) (in)/(hr) (ft2)) (deg. F.) | 1.2 |
| (cal) (cm)/(sec) (cm2) (deg. C.) | 0.00041 |
| Coefficient of Linear expansion, per | |
| degree F. | $30 \times 10^{-6}$ |
| degree C. | $54 \times 10^{-6}$ |
| Water Resistance, % gain in 24 Hrs. at 25 degrees C. | 0.4 |
| Dielectric Constant, 60 Hz | 3.7 |
| 1 kHz | 3.1 |
| 1 mHz | 2.9 |
| Dissipation Factor, 60 Hz | 0.02 |
| 1 kHz | 0.01 |
| 1 MHz | 0.01 |
| Dielectric strength, volts/mil (kv/mm) | 375 (14.7) |
| Resistivity, ohm-cm | 1013 |
| Flexural Strength, psi (kg/cm2) | 4,000 (281) |
| Useful temperature, deg. F. (deg. C.) | −100 to +225 |

(−73 to +108)

A microballoon is a small (particle diameter size range, 30 to 180 microns; wall thickness about 1.5 microns), hollow synthetic resin particle or glass sphere having a specific gravity of less than one to make it float. Thus an epoxy filled (saturated) with these microballoons such as STYCAST 1090-SI provides a light, strong, encapsulating material for thermoelectric heat pumps having limited weight and space requirements.

Figure 4:
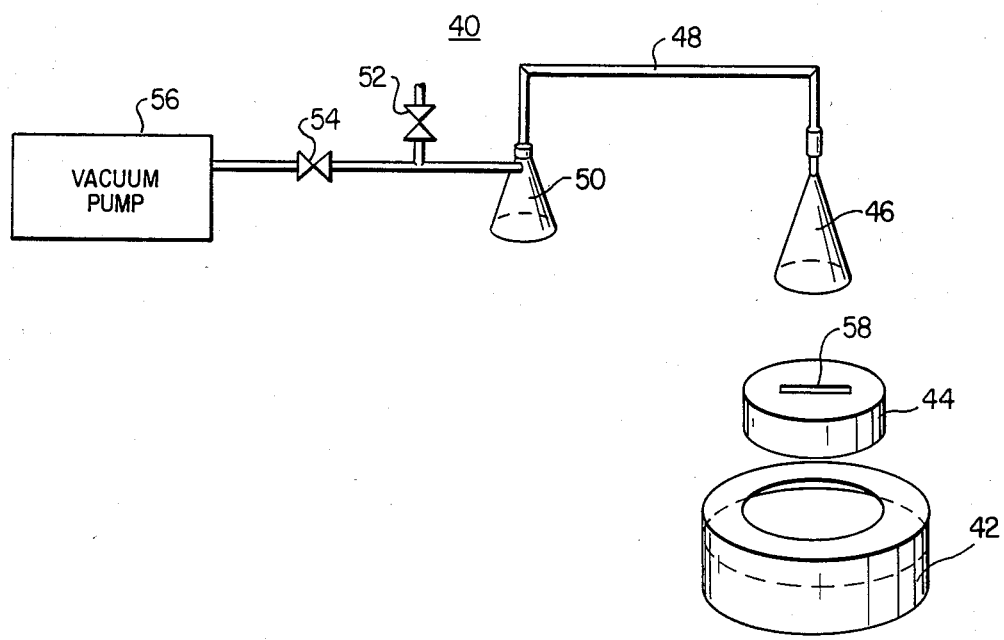
FIG. 4 illustrates, in a somewhat conventional and diagrammatic manner, an apparatus used in the practice of the invention.

An apparatus 40 suitable for practicing the invention is shown in FIG. 4. The apparatus 40 includes a suitable container or mold cup 42, a mold 44, a suction funnel 46, flexible tube 48, filter trap 50, vacuum release valve 52, vacuum control valve 54, and vacuum pump 56. The mold cup 42 has a shape corresponding to that of the mold 44.

The mold 44 is fabricated using, for example, RTV material. The mold 44 is formed using one of the thermoelectric heat pumps 12 to be encapsulated. The four sides of the thermoelectric heat pump are covered with tape in order to prevent the RTV material from seeping inbetween the elements of the thermoelectric heat pump and rendering the resulting mold useless. The mold cup 42 is then filled with RTV60 material to a depth equal to the longest side of the thermoelectric heat pump 12. That is, the depth must be sufficient to about cover the thermoelectric heat pump when it is placed in the mold standing on a side with its bottom on the smooth bottomed mold cup. The thermoelectric heat pump 12 is then centrally positioned in the mold cup 42 with its lead side face up so that the conductive leads will be extending upwardly out of the mold cup. The mold cup 42 is then slowly agitated to surface any air bubbles trapped in the RTV material, but not so vigorously as to form air bubbles. Any bubbles surfacing should be popped. A toothpick is suitable for this operation. The mold cup, RTV material and thermoelectric heat pump are then placed in an oven at 60 degrees Celsius until cured (about 15 minutes). After curing the thermoelectric heat pump is carefully removed from the mold and then the mold is removed from the mold cup. This process is repeated to form as many molds as desired. Thus, the mold 44 has walls forming a slot 58 for a thermoelectric heat pump.

Figure 5:
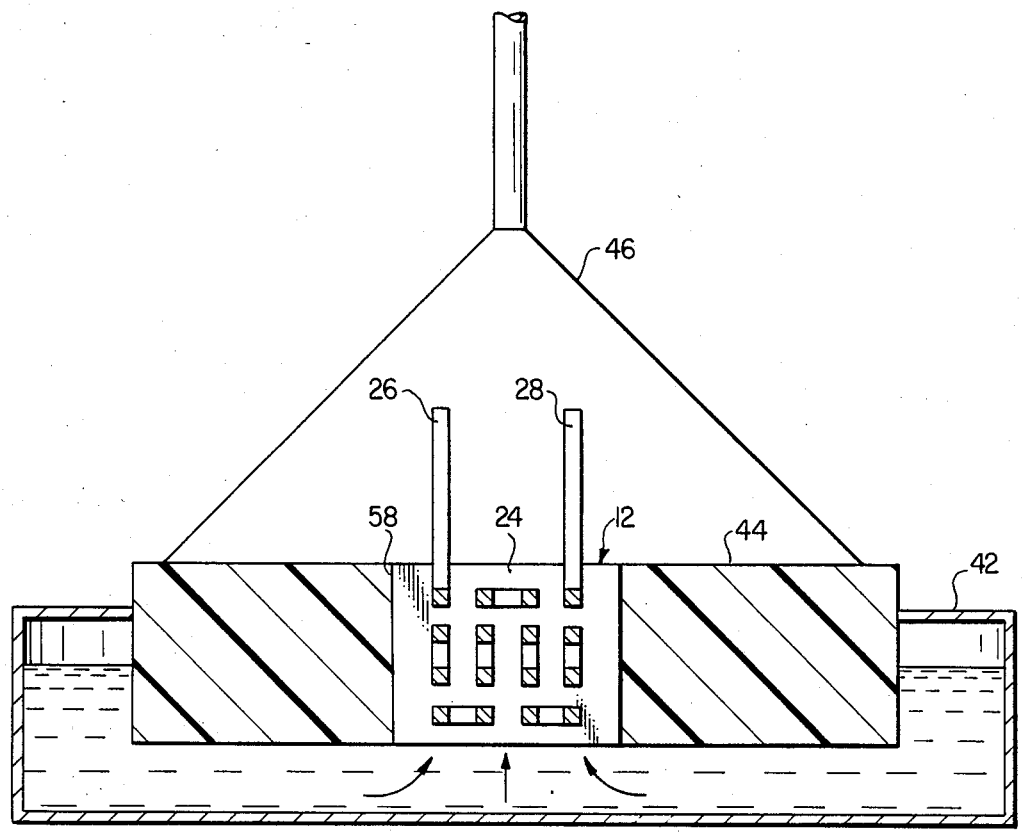
FIG. 5 is a view partly in section showing in part the apparatus of FIG. 4 with a thermoelectric heat pump positioned for encapsulation.

The suction funnel 46 (FIG. 5) has an open end of a diameter exceeding the largest dimension of the thermoelectric heat pump mold slot 58 and is adapted to sealingly engage the upper surface of the mold. The vacuum raises the mold sufficiently in the mold cup when applied to allow the flow of encapsulating material up through the spaced elements of the thermoelectric heat pump. The smaller end of the funnel is connected to a first end of the flexible hose 48. The second or opposing end of hose 48 (FIG. 4) is connected to the filter trap 50.

The filter trap 50 is used to collect any encapsulating material drawn through the hose 48 by the vacuum pump 56. The trap thereby prolongs the life of the vacuum pump. The filter trap 50 is also connected to the junction of the vacuum release valve 52 and the vacuum control valve 54. The vacuum control valve 54 is connected to the vacuum pump 56 to complete the apparatus 40.

The operation of the apparatus 40 will now be described in connection with the process of encapsulating the thermoelectric heat pump 12. The first step is to prepare the mold 44 (FIG. 5) and thermoelectric heat pump 12 for the encapsulation process by coating the mold slot 58 and the top and bottom of the mold 44 with a light coat of mold release material. Next, the top and bottom ceramics 22 and 24 (FIGS. 1 & 2) of the thermoelectric heat pump 12 are coated with the mold release material. Care must be used to prevent any of the mold release material getting on the thermoelectric elements 14 and 16. A suitable mold release material is that sold under the trademark Mold Release 122S by Emerson & Cumming.

After the coating step, the thermoelectric heat pump 12 (FIG. 5) is inserted into the mold slot 58 of mold 44 with the leads 26 and 28 extending out of the smooth (top) side of the mold 44 and the vacuum pump is turned on. At this point, the vacuum release valve 54 is open.

Then the mold 44 with the thermoelectric heat pump 12 therein is placed into the mold cup 42, and the inverted funnel 46 is place down over the mold with the leads 26 and 28 extending upwardly in the funnel.

When the funnel 46 engages the top of the mold 44, the vacuum control valve 56 is opened and the vacuum draws the funnel and mold top into sealing engagement. The vacuum then draws the encapsulating epoxy 30 up through the elements 12 and 14 (FIG. 1) of the thermoelectric heat pump 12. The amount of vacuum is controlled by the vacuum release valve 52 (FIG. 4). If more vacuum is required, the vacuum release valve is slowly closed. When the encapsulating material 30 is detected at the upper edge of the thermoelectric heat pump 12, the vacuum control valve 54 is closed, the funnel 46 carefully removed from the mold 44, the thermoelectric heat pump removed from the mold, and any excess encapsulating material removed from the thermoelectric heat pump. At this stage the encapsulated thermoelectric heat pump is inspected for any voids in the encapsulating material between elements.

The final step is to cure the encapsulated thermoelectric heat pump 12 in an oven for about sixteen hours at a temperature of about 70 degrees Celsius.

It will be appreciated by those skilled in the art that the process can be controlled by a programmed computer, and that the apparatus can be expanded to include means necessary to encapsulate any preselected number of thermoelectric heat pumps simultaneously. Also, the apparatus as shown is for a single stage thermoelectric heat pump mold, it will be appreciated that a mold for a multistage thermoelectric heat pump can be made for the apparatus for encapsulating a multistage electric heat pump.

Although only a single embodiment of the invention has been described it will be apparent to a person skilled in the art that various modifications to the details of construction shown and described may be made without departing from the scope of the invention.

What is claimed is:

1. A thermoelectric heat pump for use in high stress applications comprising:
   a plurality of spaced n-type and p-type thermoelectric elements arranged in rows and columns of alternatively positioned n- and p-types;
   first and second substrates, first and second metalizations formed on said substrates, the first and second metalizations operatively connecting the plurality of spaced n-type and p-type thermoelectric elements; and
   encapsulating means positioned in the spaces between the plurality of spaced n-type and p-type thermoelectric elements, the encapsulating means having a specific gravity of less than about 0.8 and of sufficient strength to withstand gravitational forces exceeding 2,000 g's, wherein the thermoelectric heat pump is substantially strengthened against gravitational forces.

2. A thermoelectric heat pump according to claim 1 wherein the encapsulating means is a syntactic foam.

3. A thermoelectric heat pump according to claim 2 wherein the syntactic foam is an epoxy substantially filled with hollow glass particles.

4. A thermoelectric heat pump according to claim 3, wherein the epoxy filled with hollow glass particles has a thermal conductivity of about 1.2 and a dielectric constant of about 3.7 at 60 Hz.

5. A thermoelectric heat pump suitable for applications involving stresses above 2,000 g's comprising:

a plurality of spaced n-type and p-type conductivity thermoelectric elements arranged in an alternatively relationship, the thermoelectric elements having first and second opposing ends;

first and second insulating substrates having first and second metalizations of conductive material formed thereon, the first and second metalizations having preselected patterns for selectively connecting corresponding first and second ends of the thermoelectric elements to form a serially connected array of thermoelectric elements for a thermoelectric heat pump;

means connecting the first and second opposing ends of the thermoelectric elements to the corresponding first and second metalizations of the first and second substrates;

first and second leads connected, respectively, to the first n-type and last p-type thermoelectric elements of the serially connected array of thermoelectric elements for connection to a source or power; and encapsulation material filling the spaces between the plurality of spaced n-type and p-type conductivity thermoelectric elements for strengthening the thermoelectric heat pump to withstand gravitational forces above about 2,000 g's said encapsulation material including a plastic material substantially filled with hollow particles having a size in the range of about 30 to 180 microns and a wall thickness of about 1.5 microns for reducing substantially the specific gravity and increasing substantially the strength of the encapsulating material.

* * * * *